(12) United States Patent
Noji

(10) Patent No.: US 6,430,717 B1
(45) Date of Patent: *Aug. 6, 2002

(54) SEMICONDUCTOR INTEGRATED CIRCUIT DEVICE AND METHOD FOR MONITORING ITS INTERNAL SIGNAL

(75) Inventor: Hiroyuki Noji, Chigasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/609,775

(22) Filed: Jul. 3, 2000

Related U.S. Application Data (63) Continuation of application No. 09/296,270, filed on Apr. 22, 1999, now Pat. No. 6,138,255.

(30) Foreign Application Priority Data

Apr. 22, 1998 (JP) .......................................... 10-111697
Apr. 15, 1999 (JP) .......................................... 11-108095

(51) Int. Cl.[7] ............................................. G11C 29/00
(52) U.S. Cl. ........................ 714/718; 714/719; 714/721; 714/745; 365/201

(58) Field of Search ................................. 714/718, 733, 714/734, 724, 735, 719, 721, 745; 365/201, 230.02, 230.03

(56) References Cited

U.S. PATENT DOCUMENTS 4,459,686 A * 7/1984 Toyoda ....................... 365/201
5,734,661 A * 3/1998 Roberts et al. .............. 714/733

FOREIGN PATENT DOCUMENTS

JP            5-72291        3/1993

* cited by examiner

Primary Examiner—Emmanuel L. Moise
(74) Attorney, Agent, or Firm—Banner & Witcoff, Ltd.

(57) ABSTRACT

A semiconductor integrated circuit device, which has an internal circuit that operates during a normal operation on the basis of a reference signal and input signals supplied from the outside of the device. A detecting circuit detects the voltage level of the reference signal. When the detecting circuit has detected that the reference signal is at a predetermined voltage level that differs from a voltage level assumed during the normal operation, a transfer circuit transfers an internal signal in the internal circuit to the outside of the device, instead of the regular output signal of the internal circuit.

18 Claims, 11 Drawing Sheets

SEMICONDUCTOR INTEGRATED CIRCUIT DEVICE AND METHOD FOR MONITORING ITS INTERNAL SIGNAL

This application is a continuation of prior application Ser. No. 09/296,270 filed Apr. 22, 1999 now U.S. Pat. No. 6,138,255.

BACKGROUND OF THE INVENTION

This invention relates to a semiconductor integrated circuit device having a function for monitoring an internal signal which is not output to the outside of the device during the normal operation, and also relates to a method for monitoring the internal signal.

In semiconductor integrated circuit devices, the internal signal of a circuit formed on a silicon chip is generally monitored to estimate the characteristics of the circuit or perform failure analysis. There are some internal signal monitoring methods—a method for bringing a pico-probe into circuit wiring to thereby observe a signal waveform using an oscilloscope; a method for incorporating, in advance, a monitoring pad in a circuit node to be observed to thereby observe a signal waveform which appears in the monitoring pad; etc. In these methods, however, the internal signal cannot be monitored unless the silicon chip is exposed, i.e. if it is packaged.

While the refining of semiconductor devices is being advanced, the securing of their reliability is being considered more and more important, and therefore various reliability tests are being performed. To analyze a failure, if any, by the reliability tests, it is necessary to reproduce the failure. Since in the aforementioned methods, however, it is necessary to break the package so as to expose the silicon chip, which means that the atmosphere of the circuit formed on the chip changes and hence the failure may not be faithfully reproduced. To avoid this, a method is employed in which a test mode for monitoring the internal signal (an internal signal monitoring function) is beforehand provided in a semiconductor integrated circuit device as one of the operation modes, and the test mode is used to output an internal signal from its external terminal in order to enable observation of the internal signal with the package sealed. This test mode is used by a mender when they perform failure analysis, and not usually by a user.

Figure 1:
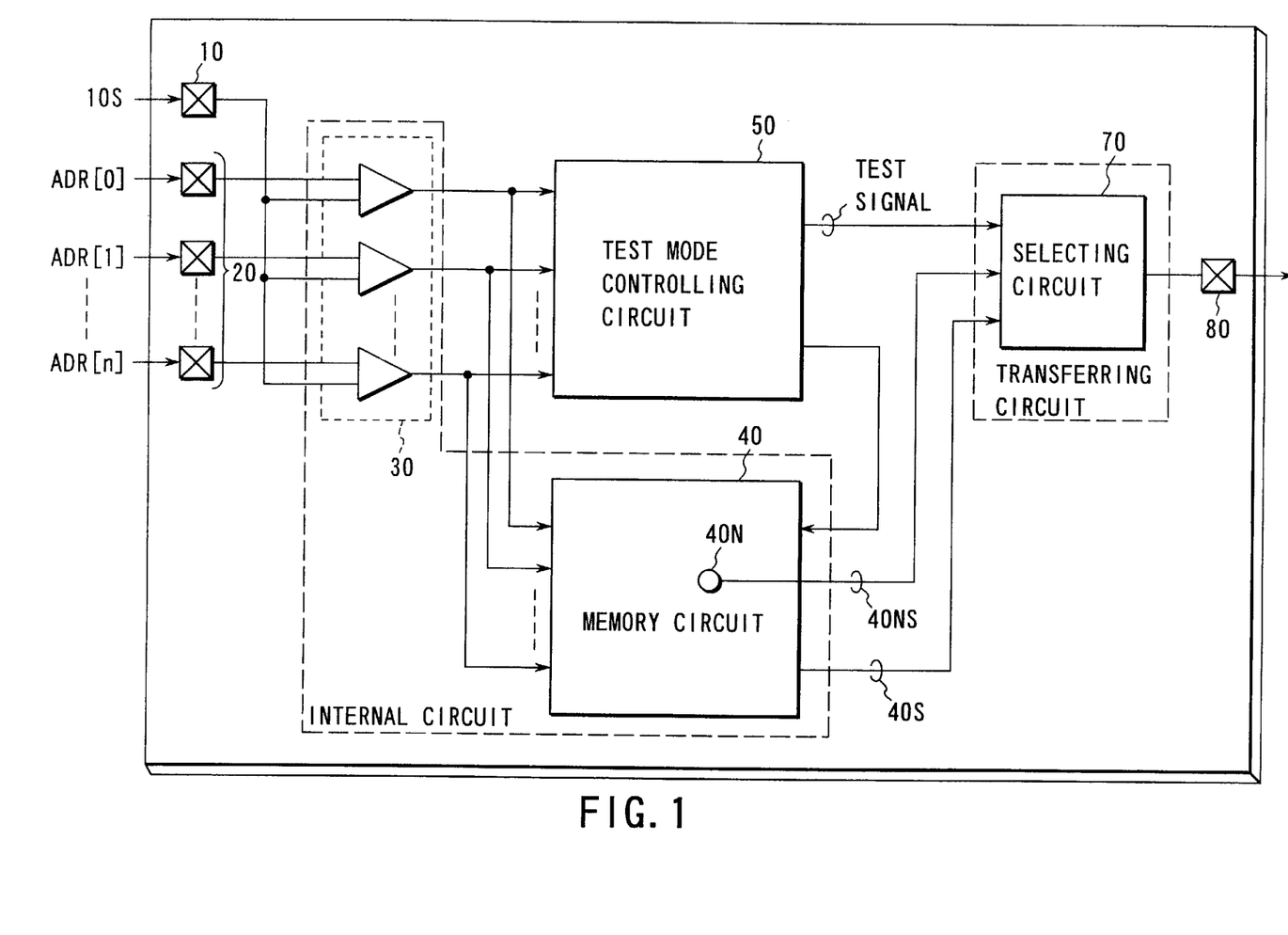
FIG. 1 is a block diagram illustrating the structure of a semiconductor integrated circuit device as the background art of the present invention.

FIG. 1 is a block diagram illustrating the structure of a semiconductor integrated circuit device, specifically a semiconductor memory, with a monitor function for monitoring its internal signal.

As is shown in FIG. 1, a pad 10 receives, from the outside, a predetermined reference signal that has a half level of the power voltage. Input buffer circuits 30 refer to the reference signal applied to the pad 10 to thereby determine the logic level of input signals ADR[0]–ADR[n] applied from the outside to pads 20 and then to convert them into signals of a level appropriate for the device dealing with them. A memory circuit 40 is a circuit which functions during the normal operation. This circuit receives an address from the outside via the input buffer circuit group 30, thereby performing a predetermined operation and outputting storage data (an output signal). A test mode controlling circuit 50 is used to generate a test mode in the device. This circuit determines the operation mode on the basis of a signal input from the outside via the input buffer circuit group 30, thereby outputting a test signal indicative of a test mode. A selecting circuit 70 selects an internal signal appearing at a predetermined internal node 40N of the memory circuit 40 when the test signal from the test mode controlling circuit 50 has been activated, and selects the regular output signal of the memory circuit 40 when the test signal has been deactivated.

In the conventional device, an input signal from the outside is input to the memory circuit 40 via the input buffer circuit group 30 during the normal operation, and the memory circuit 40 performs a predetermined operation. At this time, the test signal from the test mode controlling circuit 50 is in the deactivated state, and the selecting circuit 70 selects the regular output signal of the memory circuit 40. Accordingly, the regular output signal is output to the outside via the pad 80.

To monitor the internal signal of the memory circuit 40, input signals ADR[0]–ADR[n] are set from the outside so as to satisfy predetermined conditions (such as a predetermined combination of logical values of input signals, a predetermined inputting order of the input signals, etc.). As a result, the test mode is made as an entry into the test mode controlling circuit 50, and the test signal from the circuit 50 is activated. When the test signal has been activated, the selecting circuit 70 selects the internal signal, which means that the internal signal is monitored.

Usually, the semiconductor device is mounted on, for example, a printed circuit board (PCB) together with other devices, and a bus, for example, is commonly used between the devices. There is a case where an operation noise from another device is input via the bus, with the result that the test mode is erroneously generated. Once the test mode is generated, it is kept activated and the semiconductor device malfunctions unless a prodess sequence for terminating the test mode is performed. Further, when the test mode has been erroneously generated, the internal signal is output to the outside of the semiconductor device, instead of the regular output signal. Any other device which has received the output internal signal malfunctions. Specifically, where the external terminal that outputs the internal signal functions as an input terminal during the normal operation, the input level of any other semiconductor device which uses the common bus connected to the input terminal deviates from its appropriate level. Further, where the external terminal that outputs the internal signal functions as an output terminal during the normal operation, the input level of any other semiconductor device which receives a signal from the output terminal deviates from its appropriate level.

BRIEF SUMMARY OF THE INVENTION

The present invention has been developed in light of the above circumstances and is aimed at providing a semiconductor integrated circuit device that is free from a malfunction due to generation of a test mode, and a method for monitoring its internal signal.

To attain the above aim, there is provided a semiconductor integrated circuit device comprising: an internal circuit which operates during a normal operation on the basis of a reference signal and input signals supplied from the outside of the device; a detecting circuit for detecting whether the reference signal is at a predetermined voltage level that differs from a voltage level assumed during the normal operation; and a transfer circuit for transferring an internal signal in the internal circuit to the outside of the device on the basis of a detection result of the detecting circuit.

In the semiconductor integrated circuit device constructed as above, the voltage level of a reference signal is detected, and an internal signal in the internal circuit is transferred to the outside of the device when the reference signal is at a predetermined voltage level that differs from a voltage level assumed during the normal operation. Since a mode for transferring the internal signal of the internal circuit, for example, a test mode for monitoring the internal signal, is generated using the voltage level of the reference signal, erroneously output of the internal signal during the normal operation can be prevented.

Accordingly, the test mode for monitoring the internal signal is prevented from being erroneously generated, and hence an erroneous operation of the device due to the generation of the test mode can be avoided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Semiconductor memories according to the embodiments of the invention, which each include a high-speed input buffer circuit for fetching an input signal from the outside with reference to a reference signal, will be described referring to the accompanying drawings. In the drawings, like reference numeral denotes like element, and a duplicate description will be omitted.

[First Embodiment]

Figure 2:
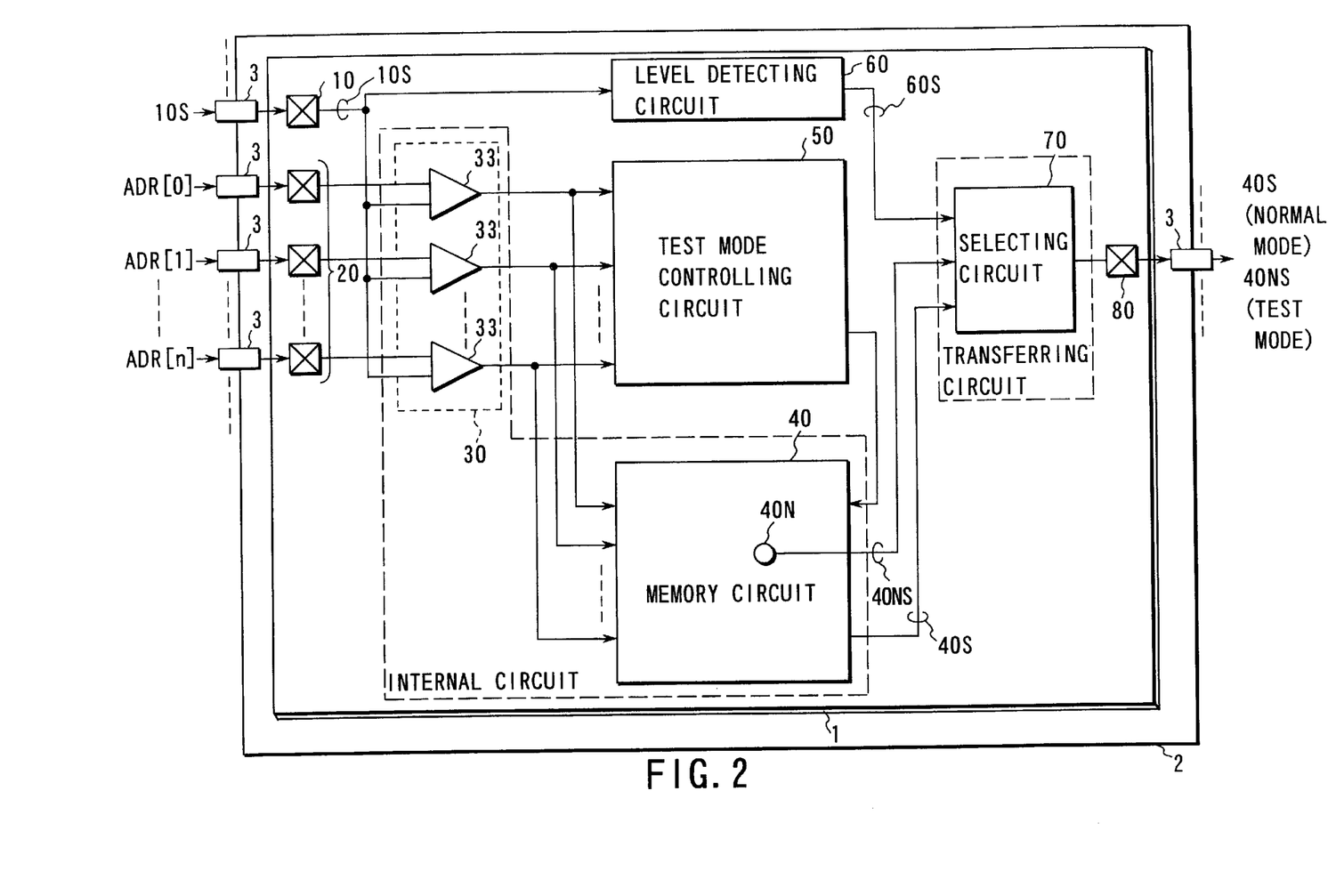
FIG. 2 is a block diagram illustrating the structure of a semiconductor memory according to a first embodiment of the invention.

FIG. 2 is a block diagram illustrating the structure of a semiconductor memory according to a first embodiment of the invention. The semiconductor memory of the first embodiment detects the voltage level of a reference signal 10S applied thereto from the outside, and activates a test mode when the voltage level of the reference signal 10S has a value different from that assumed in a normal operation mode.

As is shown in FIG. 2, a memory chip 1 is contained in a package 2. The chip 1 has pads 10, 20 and 80, which are electrically connected to respective external terminals 3 provided in the package 2. The reference signal 10S is applied to the pad 10 from the outside via the corresponding external terminal 3. Input signals ADR[0]–ADR[n] such as address signals are applied to the pads 20 from the outside via the corresponding external terminals 3. In the normal operation mode, the voltage level of the reference signal 10S is set at an intermediate level (e.g. ½ a power voltage Vcc) between a "LOW" level and a "HIGH" level of the input signals ADR[0]–ADR[n]. In a test mode, the voltage level of the reference signal 10S is set at the same "LOW" level as that of the input signals. The input signals ADR[0]–ADR[n] are supplied to an input buffer circuit 30.

The input buffer circuit 30 includes a plurality of comparators 33. Each comparator 33 determines the logic level of a corresponding one of the input signals ADR[0]–ADR[n] with reference to the reference signal 10S, and further converts the signal level (voltage level) of the corresponding input signal into a level appropriate for the device dealing with the signal within the chip 1. The output of the input buffer circuit 30 is supplied to a test mode controlling circuit 50.

A memory circuit 40 and the input buffer circuit 30 constitute an internal circuit for realizing the normal function of the device in the normal operation mode. The memory circuit 40 is an object to be monitored in a test mode. In the normal operation mode, the memory circuit 40 performs a predetermined operation on the basis of the input signals ADR[0]–ADR[n]. For example, in a read mode, the memory circuit 40 outputs an output signal 40S as storage data. The output signal 40S is the normal output of the device, and will be referred to as a "regular output signal". In a test mode, an internal signal 40NS that appears at a predetermined internal node 40N of the memory circuit 40 is monitored. The internal signal 40NS can be monitored irrespective of whether the memory circuit 40 is in the operative state or in the inoperative state. On the basis of whether the "LOW" level of the reference signal 10S is higher or lower than the "LOW" level of the input signals ADR[0]–ADR[n], it is determined whether the memory circuit 40 should be set in the operative state or in the inoperative state. Further particulars will be given later.

In a test mode, the test mode controlling circuit 50 generates one of test modes in accordance with a combination of logical values of the input signals ADR[0]–ADR[n]. If only the internal signal 40NS is output via the external terminal 3 in a test mode, the test mode controlling circuit 50 is not necessary. In other words, the test mode controlling circuit 50 is mounted on the chip 1 only when necessary.

The level detecting circuit 60 detects whether the reference signal 10S is at the "LOW" level, i.e. whether the signal 10S has reached a predetermined voltage level, thereby activating a detection signal 60S.

A selecting circuit 70 selects one of the internal signal 40NS and the output signal 40S of the memory circuit 40 on the basis of the detection signal 60S, and transfers it to the outside via the pad 80 and the external terminal 3. The selecting circuit 70 selects the internal signal 40NS when the detection signal 60S has been activated, and selects the regular output signal 40S when the signal 60S has been deactivated.

Figure 3:
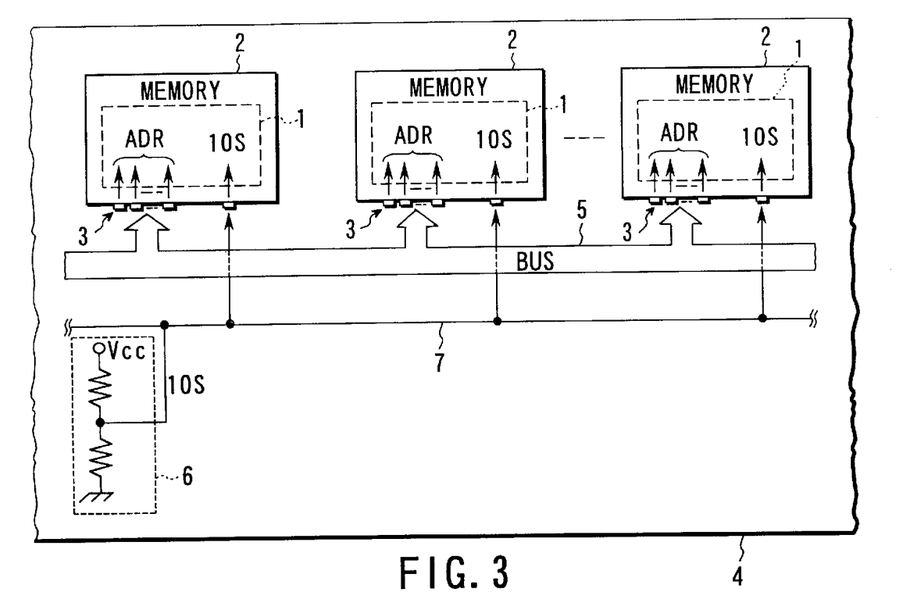
FIG. 3 is a block diagram illustrating an example of a memory module using the semiconductor memory of the first embodiment of the invention.

FIG. 3 is a block diagram illustrating an example of a memory module using the semiconductor memory of the first embodiment. FIG. 3 shows only part of the memory module.

As is shown in FIG. 3, a plurality of packages 2 (hereinafter referred to as "semiconductor memories 2" for convenience' sake) each containing a memory chip 1 are mounted on a printed circuit board (PCB) 4. The semiconductor memories 2 are connected to each other a bus 5 printed on the PCB 4, thereby constituting a memory module. A voltage dividing circuit 6 is mounted. on or formed on the PCB 4. The voltage dividing circuit 6 subjects the power voltage Vcc to resistance division to create the reference signal 10S of a voltage level half the power voltage Vcc. The reference signal 10S is supplied to a wire 7 formed on 7 the PCB 4. The wire 7 is connected to the semiconductor memories 2.

Noise-control measures are taken in the voltage dividing circuit 6 and the wire 7 so that the reference signal 10S will contain no noise. Accordingly, what kinds of operation states any other devices mounted on the single system, e.g. on the PCB 4, assume, there is almost no possibility of the reference signal 10S being influenced by the devices.

To test the semiconductor memories 2, it suffices if one of the memories 2 which is to be tested is removed from the PCB 4, and a signal of the "LOW" level is applied as the reference signal 10S to the external terminal of the removed memory 2.

Specific examples of circuits will now be described.

Figure 4A:
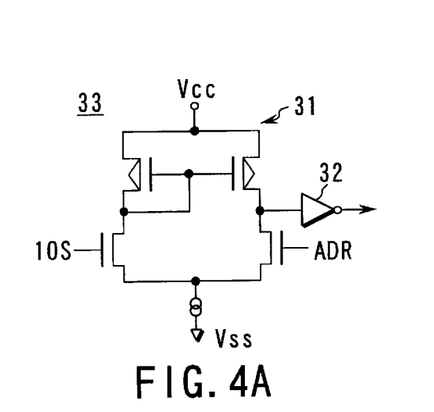
FIG. 4A is a circuit diagram showing an example of an input buffer circuit.

FIG. 4A is a circuit diagram showing an example of the comparator 33 included in the input buffer circuit 30.

As is shown in FIG. 4A, each comparator 33 compares the signal levels of the reference signal 10S and a corresponding input signal ADR, and outputs a logical level corresponding to the comparison result. The comparator 33 according to the example comprises a well-known current mirror type differential amplifier 31, and an inverter 32 for shaping the waveform of the output of the differential amplifier 31.

Figure 4B:
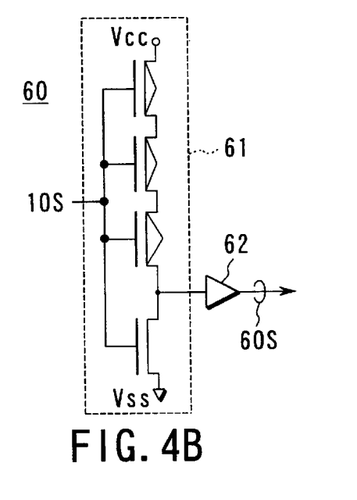
FIG. 4B is a circuit diagram showing an example of a level detecting circuit.

FIG. 4B is a circuit diagram showing an example of the level detecting circuit 60.

As is shown in FIG. 4B, the level detecting circuit 60 according to the example comprises a CMOS inverter 61 having an input threshold value shifted to a "LOW" level side (a ground potential side), and a buffer 62 for shaping the waveform of the output of the inverter 61. The level detecting circuit 60 activates the detection signal 60S and outputs a "HIGH" level signal when the reference signal 10S is lower than the input threshold value of the inverter 61, thereby detecting that the reference signal 10S has reached the predetermined voltage level. The inverter 61 includes three p-channel MOS transistors (hereinafter referred to as a "PMOS") having their current paths connected in series, and a single n-channel MOS transistor (hereinafter referred to as an "NMOS"). The mutual conductance of the PMOS is set lower than that of the NMOS. As a result, the input threshold value of the inverter 61 is shifted to the "LOW" level side.

Figure 4C:
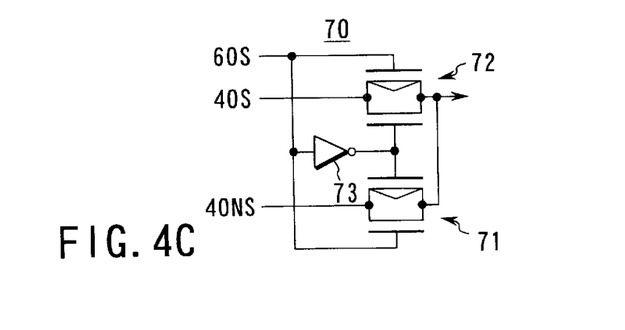
FIG. 4C is a circuit diagram showing an example of a selecting circuit.

FIG. 4C is a circuit diagram showing an example of the selecting circuit 70.

As is shown in FIG. 4C, the selecting circuit 70 according to the example includes a transfer gate 71 for transferring the internal signal 40NS to the pad 80, a transfer gate 72 for transferring the regular output signal 40S to the pad 80, and an inverter 73 for inverting the level of the detection signal 60S to obtain an inverted phase signal. The transfer gates 71 and 72 become complementarily conductive on the basis of the detection signal 60S. Further, the transfer gates 71 and 72 each comprise a PMOS and an NMOS which have their current paths connected in parallel, and the states of the PMOS and NMOS are simultaneously controlled by the detection signal 60S.

Figure 5:
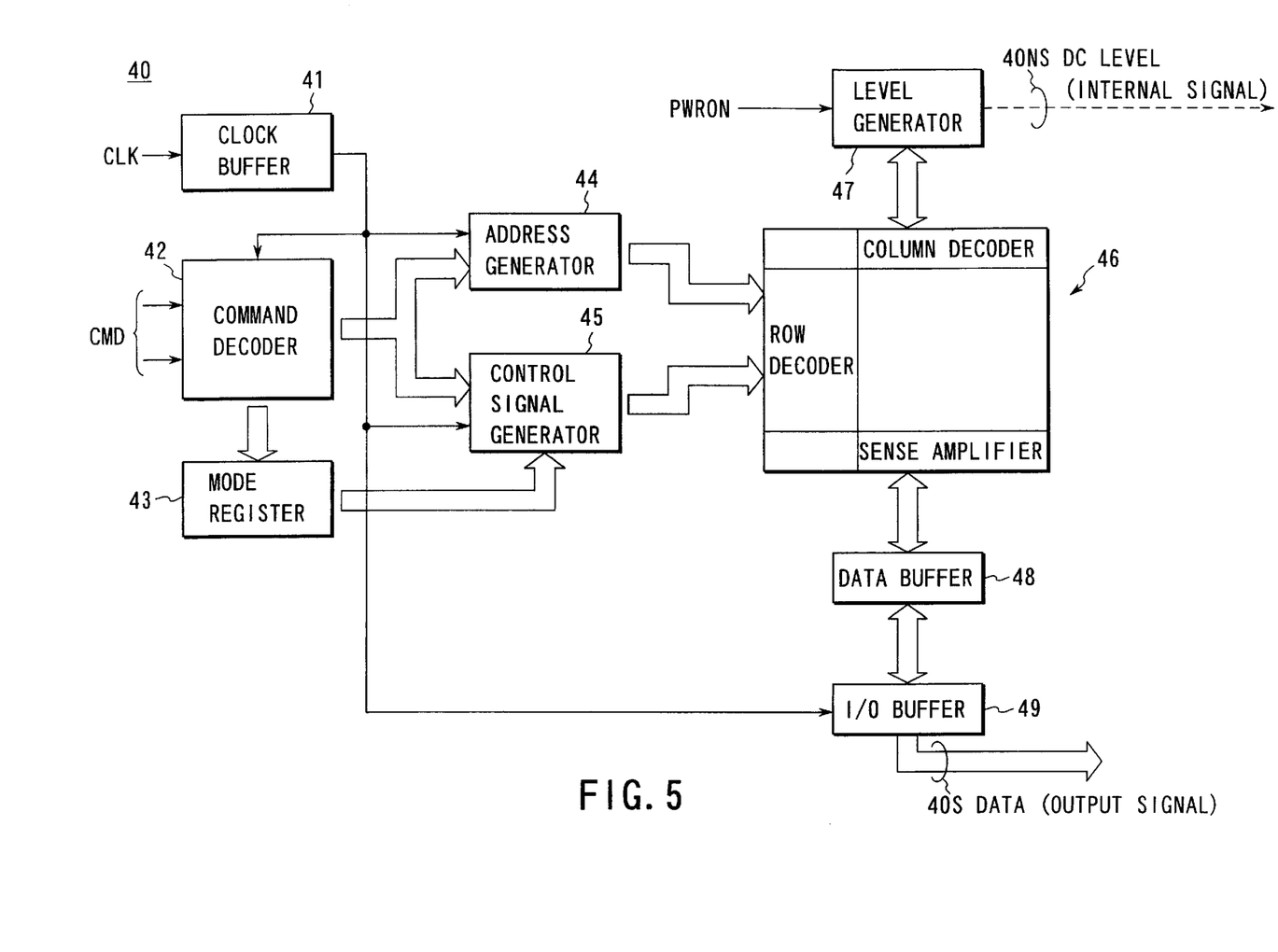
FIG. 5 is a block diagram showing an example of a memory circuit.

FIG. 5 is a block diagram showing an example of the memory circuit 40. Specifically, FIG. 5 shows a memory circuit of a packet input type.

As is shown in FIG. 5, the memory circuit 40 is constructed such that it performs a predetermined operation in synchronism with a clock signal CLK input via a clock buffer 41 and on the basis of a command signal CMD. The clock signal CLK and the command signal CMD are input as the input signals ADR[0]–ADR[n] from the outside. A command decoder 42 decodes the command signal CMD to decipher the operation mode, such as read mode and write mode. A mode register 43 for setting a burst length or data masking function. A control signal generator 45 generates various types of control signals from decoded signals of the command decoder 42 and outputted signals of the mode register 43. An address generator 44 generates addresses from decoded signals of the command decoder 42. A memory block 46 includes a row decoder, a column decoder, a memory cell array, and a sense amplifier. The row and column decoders decode addresses to determine memory cells in the memory cell array. Data in the determined memory cells is output as the output signal 40S in the read mode via a bit line (not shown), the sense amplifier, a data buffer 48 and an I/O buffer 49. A level generator 47 generates a predetermined DC level for, for example, precharging a bit line, and is set by a power "ON" signal PWRON which is activated when the power is turned on.

The predetermined node 40N of the memory circuit 40 in FIG. 2 is an optical one. It suffices if the internal signal to be monitored appears at the node. In the first embodiment, a node at which the DC level signal generated by the level generator 47 appears is selected as an example of the predetermined node 40N, and the DC level signal is monitored as the internal signal 40NS.

The operation of the device of the first embodiment will be described.

Figure 6:
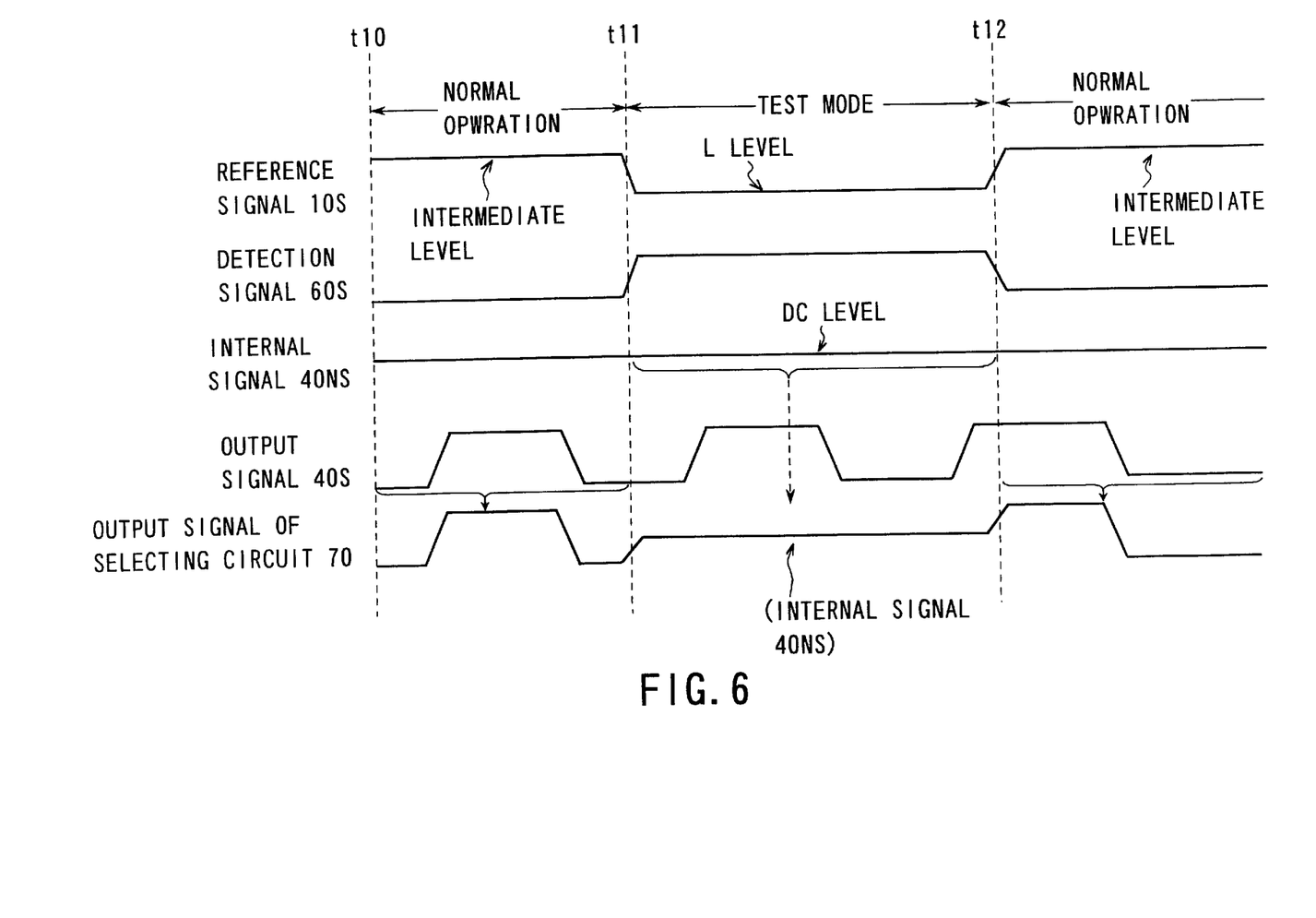
FIG. 6 is a timing chart illustrating the operation of the semiconductor memory of the first embodiment.

FIG. 6 is a timing chart illustrating the operation of the semiconductor integrated circuit device of the first embodiment.

[Normal Operation Mode]

As is shown in FIG. 6, the reference signal 10S is set at a predetermined intermediate level (e.g. ½ the power voltage) in the normal operation mode (t10). The level detecting circuit 60 detects the level of the reference signal 10S of the intermediate level as a "HIGH" level. This is because the input threshold value of the inverter 61 is shifted to the "LOW" level side. Accordingly, the detection signal 60S is deactivated and decreases to a "LOW" level. Where the detection signal S60 is at the "LOW" level, the selecting circuit 70 selects the regular output signal 40S of the memory circuit 40.

At this time, the input buffer circuit 30 refers to the reference signal 10S of the intermediate level to determine the logic levels of the input signals ADR[0]–ADR[n]. Since the level of the reference signal 10S is set at a value between a "LOW" level and a "HIGH" level of the input signals ADR[0]–ADR[n], the logic signals output from the input buffer circuit 30 reflect the logic levels of the input signals ADR[0]–ADR[n]. The memory circuit 40 supplied with the logic signals performs a normal operation and outputs a signal 40S corresponding to the normal operation mode. Thus, in the normal operation mode, the regular output signal 40S is output to the outside via the selecting circuit 70 and the pad 80.

[Test Mode]

To generate a test mode to monitor the internal signal 40NS, the external reference signal 10S is set at the "LOW" level lower than the input threshold value of the inverter 61 (t11). At this time, the level detecting circuit 60 detects that the reference signal 10S is at the predetermined voltage level, thereby activating the detection signal 60S to increase to a "HIGH" level. When the detection signal 60S has been set at the "HIGH" level, the selecting circuit 70 selects the internal signal 40NS of the memory circuit 40.

If the "LOW" level of the reference signal 10S is set lower than the "LOW" level of the input signals ADR[0]–ADR[n], the input buffer circuit 30 judges that all the input signals ADR[0]–ADR[n] are at the "HIGH" level. As a result, logic signals from the input buffer circuit 30 are all set at the "HIGH" level. Where the logic signals are input in the memory circuit 40, the circuit 40 is kept in the inoperative state. In this state, the internal signal 40NS is output to the outside via the selecting circuit 70 and the pad 80. Accordingly, the internal signal 40NS can be monitored with the memory circuit 40 kept inoperative.

If the "LOW" level of the reference signal 10S is set higher than the "LOW" level of the input signals ADR[0] –ADR[n] and lower than the input threshold value of the inverter 61, the input buffer circuit 30 outputs logic signals corresponding to the logic levels of the input signals ADR[0]–ADR[n]. Where the logic signals are input in the memory circuit 40, the circuit 40 is kept in the operative state. In this state, the internal signal 40NS is output to the outside via the selecting circuit 70 and the pad 80. Accordingly, the internal signal 40NS can be monitored with the memory circuit 40 kept operative.

To return the operation mode from the test mode to the normal operation mode, the reference signal 10S is returned to the predetermined intermediate level (t12). As a result, the selecting circuit 70 selects the regular output signal 40S and outputs it to the outside via the pad 80.

The external terminal to be connected to the pad 80, through which the internal signal 40NS is output to the outside in the first embodiment, may be used as an input terminal or an output terminal in the normal operation mode. Moreover, an extra external terminal such as a non connection terminal may be used.

In the embodiment, the level detecting circuit 60 activates the detection signal 60S when the reference signal 10S is set at the "LOW" level. However, it may be modified such that the level detecting circuit 60 activates the detection signal 60S when the reference signal 10S is set at the "HIGH" level. In other words, it suffices if the reference signal 10S has a voltage level that differs from the intermediate level set in the normal operation mode and can be detected by the level detecting circuit 60.

As described above, in the first embodiment, the test mode is generated in a single system, for example, in the PCB 4 on the basis of the voltage level of the reference signal 10S which is protected from noise. Accordingly, the test mode is prevented from being erroneously generated because of the operation of any other devices mounted on the PCB 4. Moreover, the external terminal for the reference signal 10S can also be used as an external terminal for setting a test mode, and no particular external terminal is necessary to monitor the internal signal 40NS.

[Second Embodiment]

Figure 7:
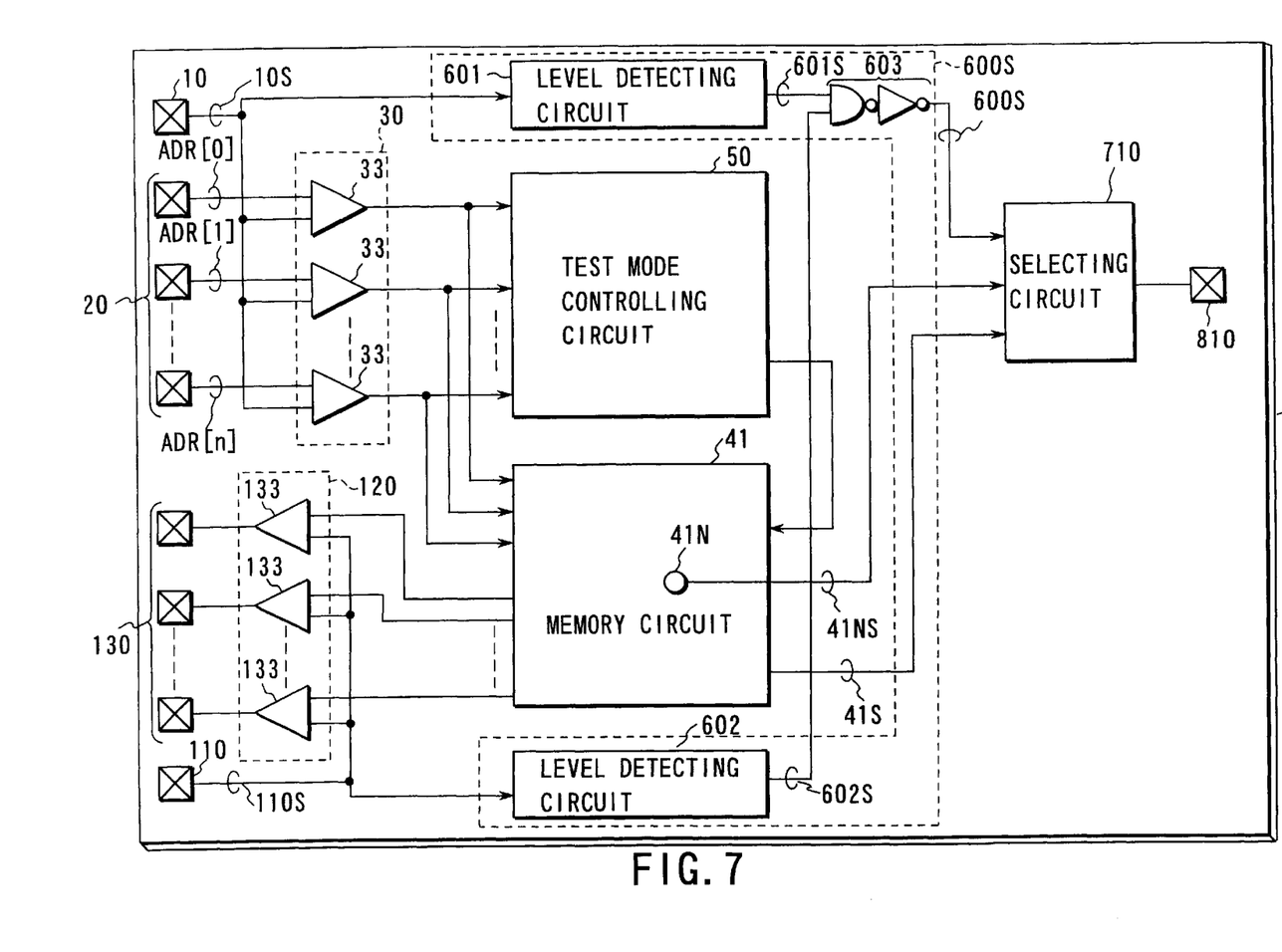
FIG. 7 is a block diagram illustrating the structure of a semiconductor memory according to a second embodiment of the invention.

FIG. 7 is a block diagram illustrating the structure of a semiconductor memory according to a second embodiment of the invention. The semiconductor memory of the second embodiment detects the voltage levels of a plurality of reference signals 10S and 110S applied thereto from the outside, and generates a test mode when the reference signals 10S and 110S are at voltage levels that differ from those in the normal operation mode.

As is shown in FIG. 7, the reference signal 10S and the reference signal 110S are applied from the outside to pads 10 and 110, respectively. Input signals are applied to pads 20 from the outside. The voltage level of the reference signal 10S is set at a value between a "LOW" level and a "HIGH" level of the input signals applied to the pads 20 in the normal operation mode, and at the same "LOW" level as that of the input signals in the test mode. Further, the voltage level of the reference signal 110S is set at an intermediate level of the "LOW" and "HIGH" levels for imparting a termination level to the common bus, and at the same "LOW" level as that of the input signals in the test mode.

A memory circuit 41 has the same structure as the memory circuit 40, receives, as addresses, input signals applied to the pads 20 via the input buffer circuit 30, and outputs, for example, an output signal 41S as data. An output buffer circuit 120 includes a plurality of converters 133. Each converter 133 judges the logic level of the output signal of the memory circuit 41 with reference to the reference signal 110S, thereby driving pads 130 on the basis of the logic level.

A level detecting circuit 600 detects whether both the reference signals 10S and 110S are set at predetermined voltage levels. When having detected that they are at the predetermined voltage levels, the level detecting circuit 600 activates a detection signal 600S. The level detecting circuit 600 comprises level detecting circuits 601 and 602 and an AND circuit 603. The level detecting circuits 600 have the same structure as the level detecting circuit 60. When having detected that the reference signal 10S is at the predetermined voltage level, the level detecting circuit 601 activates a detection signal 601S. Also, when having detected that the reference signal 110S is at the predetermined voltage level, the level detecting circuit 602 activates a detection signal 602S. The AND circuit 603 includes a NAND gate for receiving the detection signals 601S and 602S, and an inverter for inverting the output levels of the signals. The AND circuit 603 calculates the logical sum of the detection signals 601S and 602S and outputs it as the detection signal 600S. A selecting circuit 710 has the same structure as the selecting circuit 70, and is disposed to select one of an internal signal 41NS that appears in an internal node 41N of the memory circuit 41, and a regular output signal 41S, thereby outputting the selected signal to the outside via a pad 810.

The operation of the semiconductor memory will be described.

Figure 8:
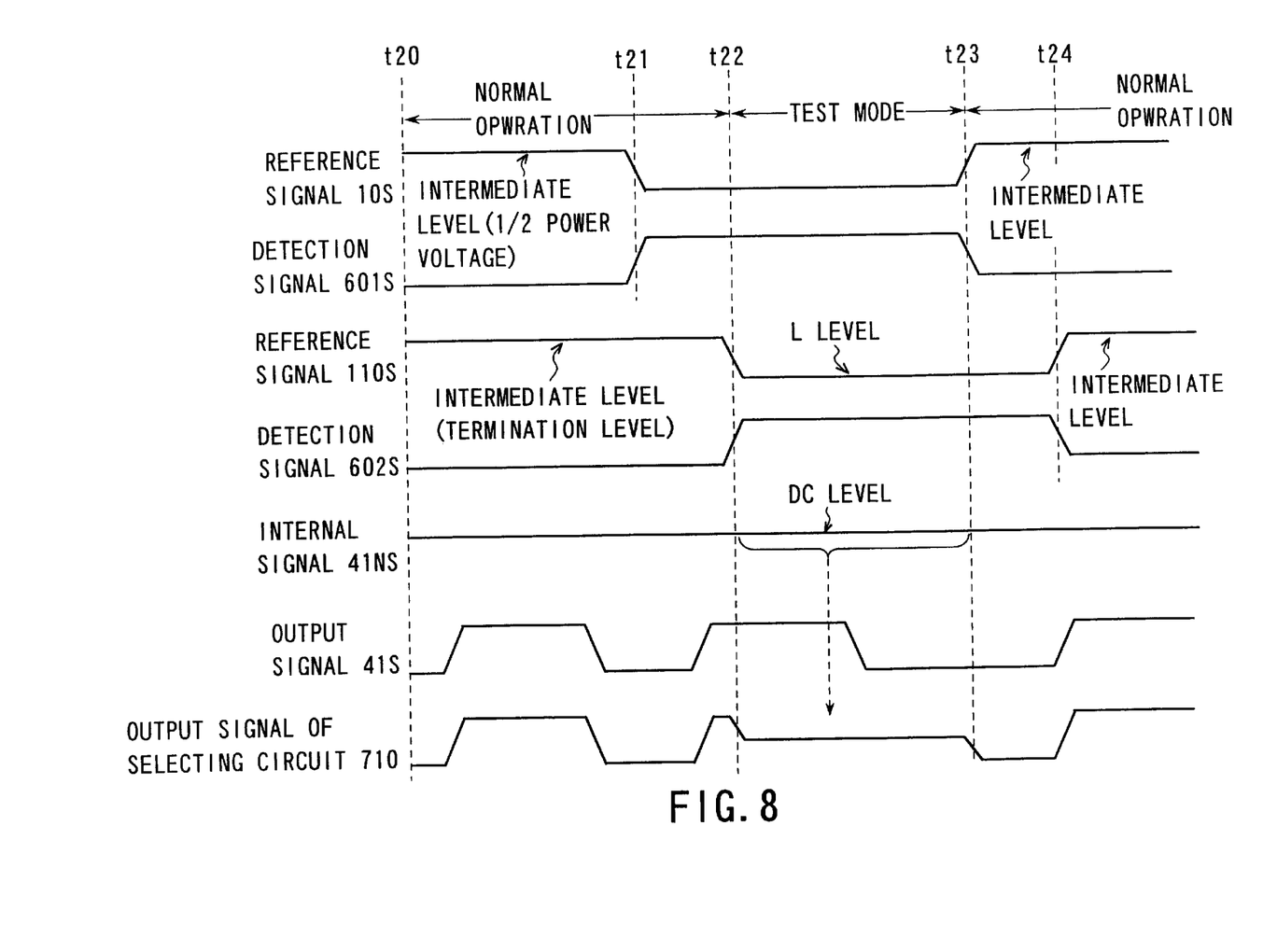
FIG. 8 is a timing chart illustrating the operation of the semiconductor memory of the second embodiment.

FIG. 8 is a timing chart illustrating the operation of the semiconductor integrated circuit device or semiconductor memory of the second embodiment.

[Normal Operation Mode]

In the normal operation mode, the reference signals 10S and 110S are set at the predetermined intermediate levels (t20). As a result, the detection signals 601S and 602S are deactivated, and the AND circuit 602 that receives the detection signals 601S and 602S deactivates its output, i.e. the detection signal 600S. Thus, the selecting circuit 710 selects and outputs the regular output signal 41S of the memory circuit 41.

[Test Mode]

When only the reference signal 10S has been set at the "LOW" level (t21), the detection signal 601S is activated. In this case, however, the reference signal 110S is not set at the "LOW" level, and hence the detection signal 602S is not activated. As a result, the AND circuit 603 keeps the detection signal 600S non-activated. Accordingly, the selecting circuit 710 successively selects the regular output signal 41S.

When the reference signal 110S has been set at the "LOW" level (t22), the detection signal 602S is activated. As a result, the selecting circuit 710 selects the internal signal 41NS of the DC level and outputs it to the outside, whereby the test mode is generated.

Further, when the reference signal 10S has been returned to the intermediate level (t23), the detection signal 601S is activated, with the result that the detection signal 600S is deactivated and the selecting circuit 710 selects the regular output signal 41S. Thus, the operation mode is returned to the normal operation mode.

Subsequently, when the reference signal 110S has been returned to the intermediate level for imparting the termination level (t24), the output buffer circuit 120 judges the logic level of the output signal of the memory circuit 41 to thereby drive the pads 130 and output the output signal of the memory circuit 41 to the outside.

In the second embodiment, only when the two reference signals 10S and 110S have been set at the "LOW" levels, i.e. at the predetermined voltage levels, the device operates in the test mode. Therefore, even when in the normal operation mode, noise has been applied to one of the reference signals 10S and 110S and hence the one of the signals has come to an abnormal voltage level, the test mode is prevented from being erroneously generated so long as the other of the signals is set at the normal level. Thus, the operation of the device in the normal operation mode extremely stabilizes.

Although in the second embodiment, the test mode is generated when both the reference signals 10S and 110S are set at the "LOW" levels, the invention is not limited to this, but may be modified such that the test mode is generated when the signals are set at the "LOW" level and the "HIGH" level, respectively, or vice versa, or at the "HIGH" levels.

[Third Embodiment]

Figure 9:
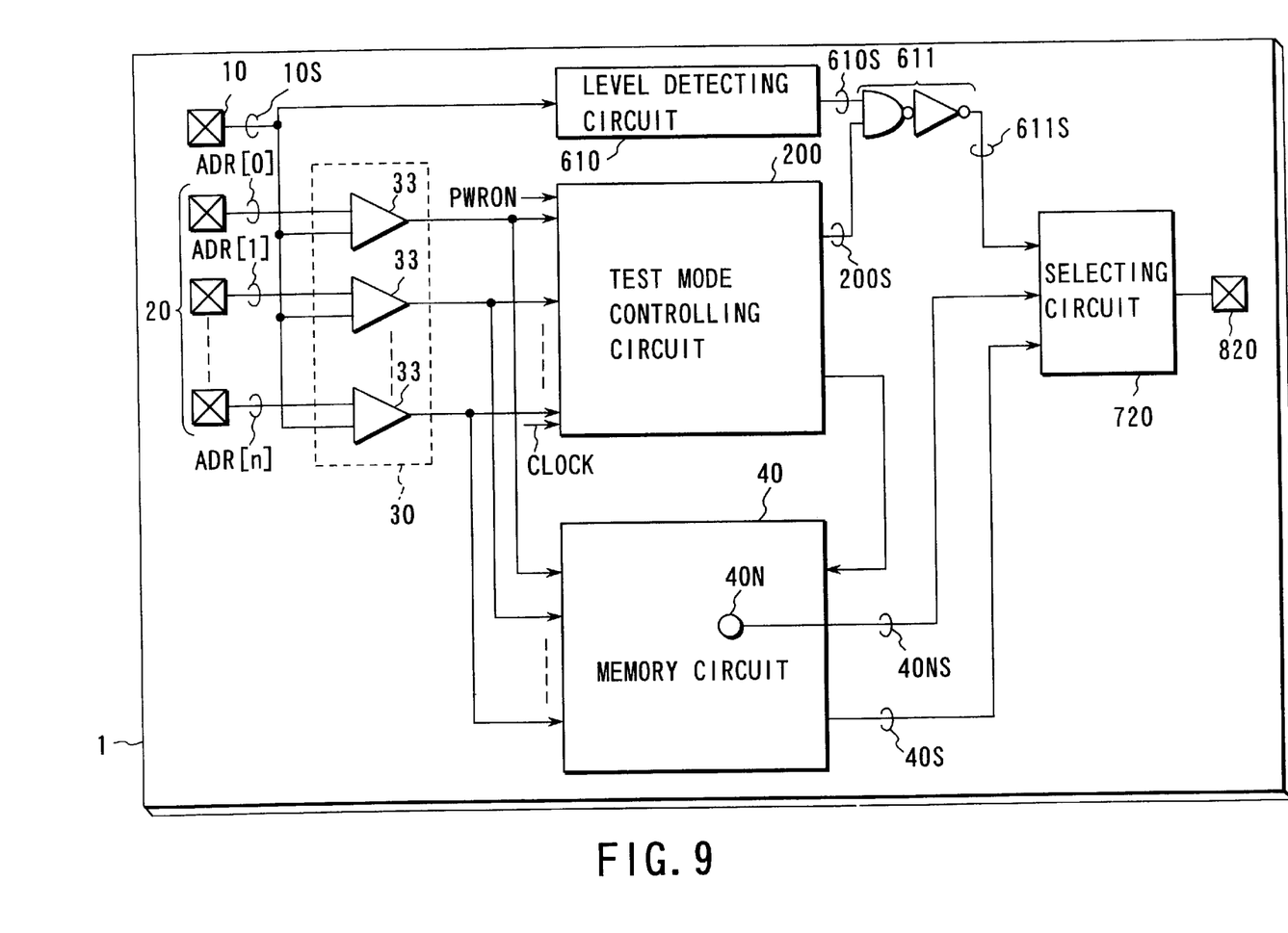
FIG. 9 is a block diagram illustrating the structure of a semiconductor memory according to a third embodiment of the invention.

FIG. 9 is a block diagram illustrating the structure of a semiconductor memory according to a third embodiment of the invention. The semiconductor memory of the third embodiment generates a test mode when it has determined that the reference signal 10S applied thereto from the outside is at a predetermined voltage level, and at the same time that a predetermined combination of logical values of the input signals ADR[0]–ADR[n] have been applied thereto from the outside.

As is shown in FIG. 9, the level detecting circuit 610 has the same structure as the level detecting circuit 60. When having detected that the reference signal 10S applied to the pad 10 has come to be at the "LOW" level, i.e. it has reached a predetermined voltage level, the level detecting circuit 610 activates and outputs a detection signal 610S.

A determining circuit (test mode controlling circuit) 200 determines a combination of logical values of the input signals ADR[0]–ADR[n] supplied from the outside via the input buffer circuit 30. When having detected that a predetermined combination of logical values of the input signals ADR[0]–ADR[n] have been input, the determining circuit 200 activates and outputs a determination signal 200S. An AND circuit 611 includes a NAND gate for receiving the detection signal 610S and the determination signal 200S, and an inverter for inverting the output of the NAND gate. The AND circuit 611 calculates the logical sum of the detection signal 610S and the determination signal 200S and outputs a detection signal 611S.

A selecting circuit 710 has the same structure as the selecting circuit 70, and is disposed to select one of the internal signal 40NS of the memory circuit 40, and its regular output signal 40S, thereby outputting the selected signal to the outside via a pad 820.

Figure 10:
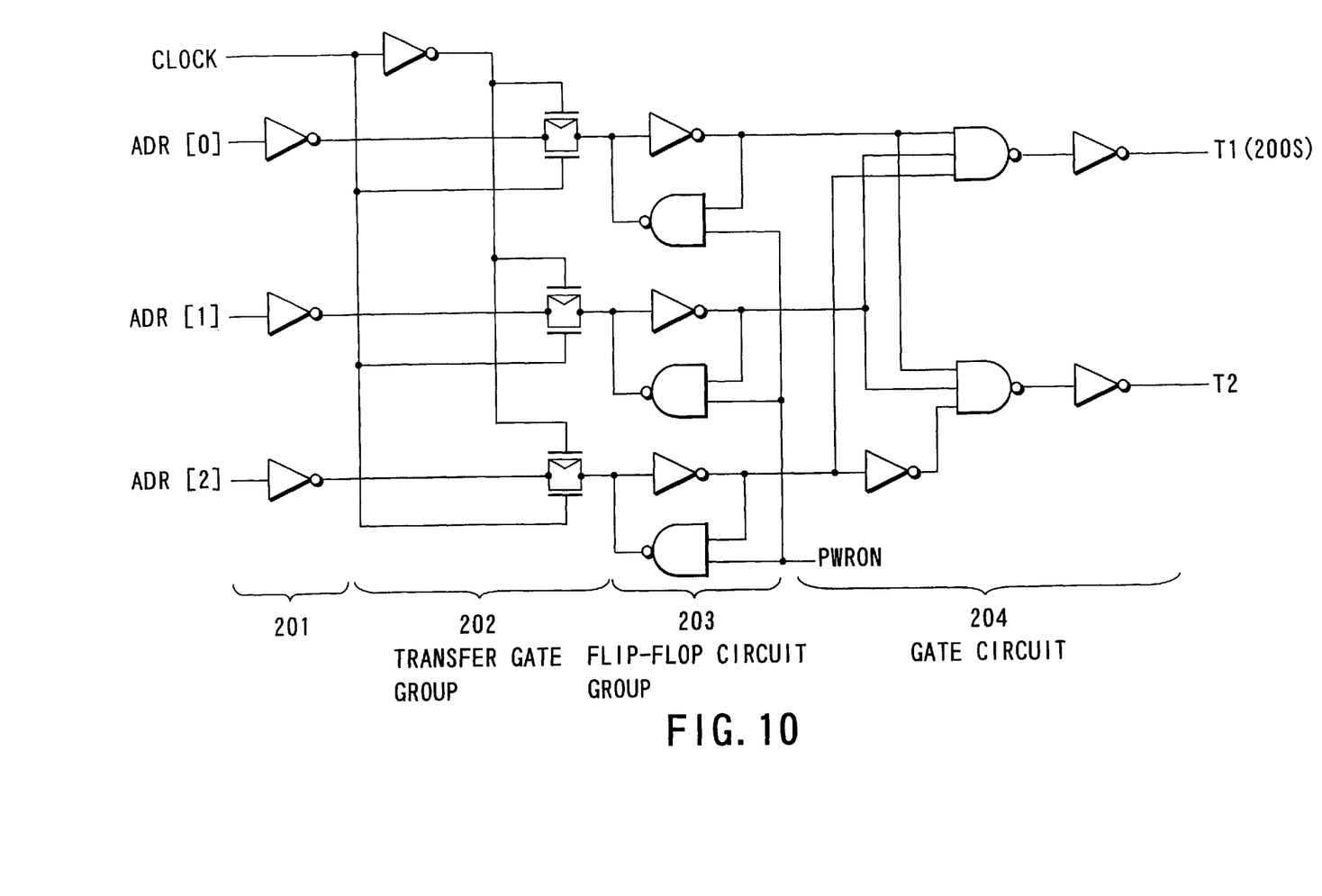
FIG. 10 is a circuit diagram showing an example of a determining circuit.

FIG. 10 is a circuit diagram showing an example of the determining circuit 200.

As is shown in FIG. 10, the determining circuit 200 determines a combination of logical values of the input signals ADR[0], ADR[1] and ADR[2]. When having determined that the logical values of the input signals ADR[0], ADR[1] and ADR[2] constitute a predetermined combination, the circuit 200 activates a test signal T1 or T2.

The determining circuit 200 comprises an inverter group 201 for inverting the input signals ADR[0], ADR[1] and ADR[2], a transfer gate circuit group 202 for transferring signals (inverted ones of the input signals) from the inverter group 201 on the basis of a clock signal CLOCK, a flip-flop circuit group 203 for holding signals transferred thereto by the transfer gate circuit group 202, and a gate circuit 204 for decoding the signals held by the flip-flop circuit group 203 and outputting the test signal T1 or T2.

The test signal T1 is supplied as the determining signal 200S from the determining circuit 200 to the AND circuit 611. When in this embodiment, the input signals ADR[0], ADR[1] and ADR[2] held by the flip-flop circuit group 203 are all at the "HIGH" level (i.e. the logical value is 1), i.e. when the logical values of the input signals constitute a predetermined combination, the test signal T1 (the determining signal 200S) is activated. Further, when only the input signal ADR[2] is at the "LOW" level (i.e. the logical value is 0), the test signal T2 is activated. The contents of the flip-flop circuit group 203 are reset by the power "ON" signal PWRON.

The operation of the determining circuit 200 will now be described.

Figure 11:
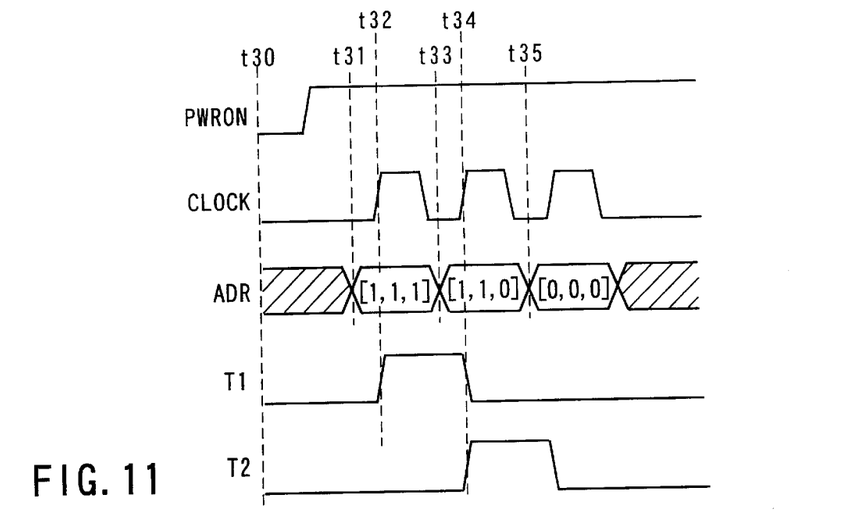
FIG. 11 is a timing chart illustrating the operation of the determining circuit.

FIG. 11 is a timing chart useful in explaining the operation of the determining circuit 200.

As is shown in FIG. 11, upon turning on the device, the power "ON" signal PWRON is kept at a "LOW" level for a predetermined period in time. As a result, the determining circuit 200 is compulsively reset, thereby initializing both the test signals T1 and T2 to their non-activated state (t30).

Subsequently, the input signals ADR[0], ADR[1] and ADR[2] are all set, up, at the "HIGH" level (logical value 1) (t31), and the clock signal CLOCK is generated (t32). Then, the input signals ADR[0], ADR[1] and ADR[2] are fetched by the flip-flop circuit group 203 via the inverter circuit group 201 and the transfer gate circuit group 202. At this time, the gate circuit 204 decodes the input signals of a predetermined logical value combination, i.e. input signals of the logical value 1, fetched by the flip-flop circuit group 203, thereby activating the test signal T1 (the determination signal 200S).

On the other hand, when only the input signal ADR[2] is set at the "LOW" level (logical value 0) (t33), the clock signal CLOCK is generated (t34), thereby causing the flip-flop circuit group 203 to fetch the input signal. As a result, the gate circuit 204 activates the test signal T2 and deactivates the test signal T1.

When the input signals ADR[0], ADR[1] and ADR[2] are all set at the "LOW" level (logical value 0) (t35), both the test signals T1 and T2 are deactivated. When using the test signal T2 as the determination signal 200S, it suffices if a combination in which only the input signal ADR[2] is set at the "LOW" level (logical value 0) is used as the predetermined combination.

The operation of the semiconductor memory of the third embodiment will be described.

Figure 12:
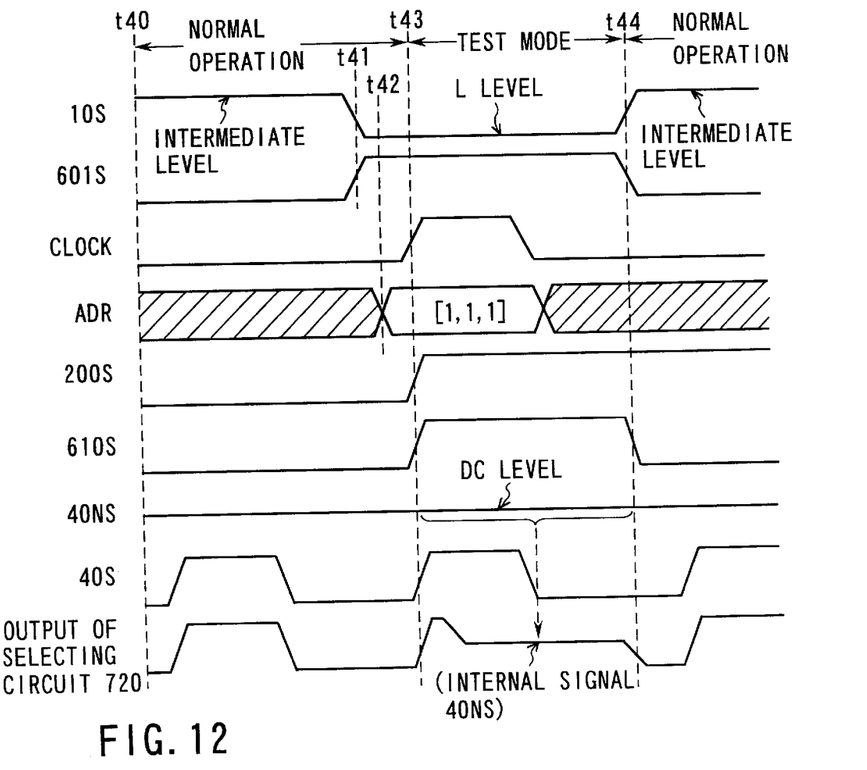
FIG. 12 is a timing chart illustrating the operation of the semiconductor memory of the third embodiment.

FIG. 12 is a timing chart useful in explaining the operation of the semiconductor memory of the third embodiment.

[Normal Operation Mode]

As is shown in FIG. 12, the reference signal 10S is set at the predetermined intermediate level in the normal operation mode (t40). Accordingly, the detection signal 610S is fixed at the "LOW" level, and the detection signal 611S is activated. Upon receiving the detection signal 611S, the selecting circuit 720 selects the regular output signal 40S of the memory circuit 40.

[Test Mode]

When the reference signal 10S has been shifted to the "LOW" level (t41), the detection signal 610S is activated. Subsequently, the input signals ADR[0], ADR[1] and ADR[2] are all set, up, at the "HIGH" level (logical value 1), and the combination of these input signals is considered a predetermined combination (t42). Subsequently, the clock signal CLOCK is generated (t43), and the determining circuit 200 determines the combination of those input signals to thereby activate the determination signal 200S. Upon receiving the activated detection and determination signals 610S and 200S, the AND circuit 611 activates the detection signal 611S. As a result, the selecting circuit 720 selects the internal signal 40NS of the memory circuit 40.

To return the operation mode to the normal operation mode, the reference signal 10S is again set at the intermediate level (t44). Accordingly, the detection signal 611S is deactivated, and the selecting circuit 720 selects the regular output signal 40S of the memory circuit 40. At this time, the flip-flop circuit group 203 constituting the determining circuit 200 receives input signals of the predetermined combination of logical values, and hence keeps the determination signal 200S in the activated state. If in this state, the reference signal 10S is shifted to the "LOW" level, the test mode is regenerated.

Where it is necessary to prevent the regeneration of the test mode by the reference signal 10S only, the input signals ADR[0], ADR[1] and ADR[2] from the outside are set to the "LOW" level (logical value 0) and input to the determining circuit 200. This initializes the state of the determining circuit 200, with the result that the test mode is regenerated only when the input signals ADR[0], ADR[1] and ADR[2] satisfy the predetermined conditions.

[Fourth Embodiment]

Figure 13:
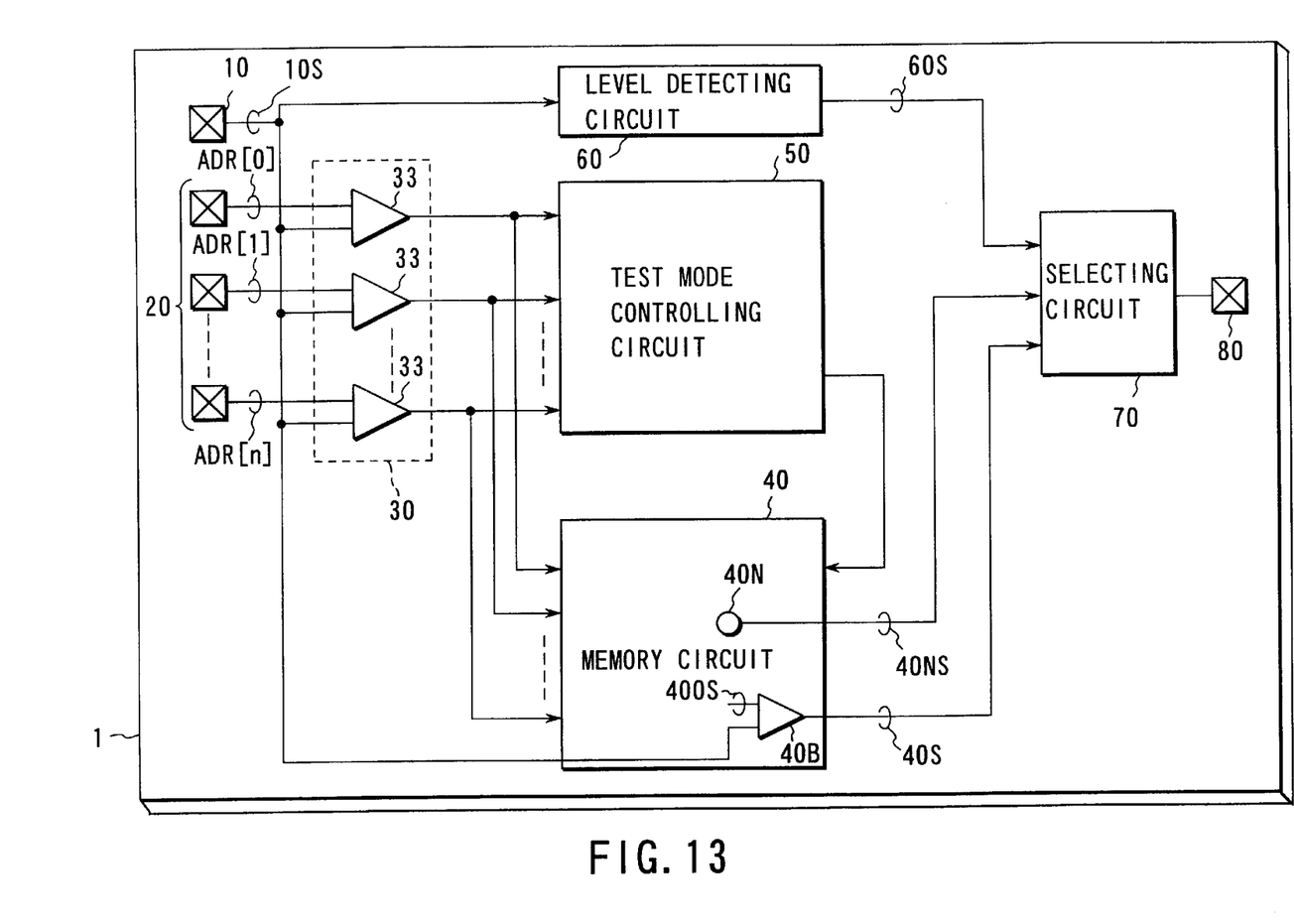
FIG. 13 is a block diagram illustrating the structure of a semiconductor memory according to a fourth embodiment of the invention.

FIG. 13 is a block diagram illustrating the structure of a semiconductor memory according to a fourth embodiment of the invention.

The above-described first embodiment may be modified such that an output buffer circuit 40B contained in the memory circuit 40 determines the logic level of an output signal 400S within the memory circuit 40 with reference to the reference signal 10S, and outputs the output signal 40S on the basis of the determination result, as is shown in FIG. 13. Even when in this structure, the internal output signal 400S has varied in the test mode, the output buffer circuit 40B is prevented from performing a switching operation, and accordingly, the operation noise of the output buffer circuit 40B can be suppressed. As a result, the internal signal 40NS can be monitored accurately without being influenced by the operation noise of the output buffer circuit 40B.

The fourth embodiment is also applicable to the second and third embodiments.

Although in the first through fourth embodiments, a test mode for monitoring an internal signal has been described, this invention can be also applied to the generation of another test mode.

Since as described above, the test mode is generated after detecting the voltage level of a reference signal input from the outside and referred to in the normal operation mode, erroneous generation of the test mode due to the operation of any other device can be suppressed. Therefore, malfunction of the device due to unintentional generation of the test mode can be avoided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
    an internal circuit configured to operate during normal operation based on a reference signal supplied from outside of the device and an output of comparators for comparing input signals supplied from outside of the device with the reference signal;
    a detecting circuit for detecting whether the reference signal is at a predetermined voltage level differing from a voltage level assumed during normal operation; and
    a transfer circuit for transferring an internal signal in the internal circuit to outside of the device based on a detection result of the detecting circuit.

2. The device according to claim 1, wherein the transfer circuit includes a selecting circuit for receiving the internal signal and a regular output signal from the internal circuit, the transfer circuit configured to select one of the internal signal and the regular output signal based on the detection result.

3. The device according to claim 2, further comprising:
    a determining circuit for determining a combination of the input signals; and
    a circuit for reflecting a determination result of the determining circuit in the detection result of the detecting circuit.

4. The device according to claim 3, wherein the internal circuit includes an output buffer for outputting the regular output signal to an external terminal, the output buffer configured to determine a logical level of the regular output signal with reference to the reference signal and drive the external terminal in accordance with the logical level.

5. The device according to claim 2, wherein the internal circuit includes an output buffer for outputting the regular output signal to an external terminal, the output buffer configured to determine a logical level of the regular output signal with reference to the reference signal and drive the external terminal in accordance with the logical level.

6. The device according to claim 1, further comprising:
    a determining circuit for determining a combination of the input signals; and
    a circuit for reflecting a determination result of the determining circuit in the detection result of the detecting circuit.

7. The device according to claim 6, wherein the internal circuit includes an output buffer for outputting the regular output signal to an external terminal, the output buffer configured to determine a logical level of the regular output signal with reference to the reference signal and drive the external terminal in accordance with the logical level.

8. The device according to claim 1, wherein the internal circuit includes an output buffer for outputting a regular output signal from the internal circuit to an external terminal, the output buffer determining a logical level of the regular output signal with reference to the reference signal and driving the external terminal in accordance with the logical level.

9. A semiconductor integrated circuit device comprising:
    an internal circuit configured to operate during normal operation based on a first reference signal and a second reference signal each supplied from outside of the device and an output of first comparators for comparing input signals supplied from outside of the device with the first reference signal;
    second comparators for comparing output signals from the internal circuit with the second reference signal, and outputting signals based on the output signals;
    a first detecting circuit for detecting whether the first reference signal is at a predetermined voltage level differing from a voltage level assumed during normal operation;
    a second detecting circuit for detecting whether the second reference signal is at a predetermined voltage level differing from a voltage level assumed during normal operation; and
    a transfer circuit for transferring an internal signal in the internal circuit to outside of the device based on detecting results of the first and second detecting circuits.

10. The device according to claim 9, wherein the transfer circuit includes a selecting circuit for receiving the internal signal and a regular output signal from the internal circuit, and selecting one of the internal signal and the regular output signal based on the detection results of the first and second detecting circuits.

11. The device according to claim 10, further comprising:
    a determining circuit for determining a combination of the input signals; and
    a circuit for reflecting a determination result of the determining circuit in the detection results of the first and second detecting circuits.

12. The device according to claim 11, wherein the internal circuit includes an output buffer for outputting a regular output signal from the internal circuit to an external terminal, the output buffer configured to determine a logical level of the regular output signal with reference to the reference signal and drive the external terminal in accordance with the logical level.

13. The device according to claim 10, wherein the internal circuit includes an output buffer for outputting a regular output signal from the internal circuit to an external terminal, the output buffer configured to determine a logical level of the regular output signal with reference to the reference signal and drive the external terminal in accordance with the logical level.

14. The device according to claim 9, further comprising:
    a determining circuit for determining a combination of the input signals; and
    a circuit for reflecting a determination result of the determining circuit in the detection results of the first and second detecting circuits.

15. The device according to claim 14, wherein the internal circuit includes an output buffer for outputting a regular output signal from the internal circuit to an external terminal, the output buffer configured to determine a logical level of the regular output signal with reference to the reference signal and drive the external terminal in accordance with the logical level.

16. The device according to claim 9, wherein the internal circuit includes an output buffer for outputting a regular output signal from the internal circuit to an external terminal, the output buffer configured to determine a logical level of the regular output signal with reference to the reference signal and drive the external terminal in accordance with the logical level.

17. A semiconductor integrated circuit device comprising:
    an internal circuit configured to operate during normal operation based on an external reference signal and input signals, the internal circuit generating an internal signal and including a comparing circuit configured to compare the input signals with the external reference signal;
    a detecting circuit for detecting whether the reference signal is at a predetermined voltage level differing from a voltage level assumed during normal operation; and
    a transfer circuit for transferring the internal signal to outside of the device based on a detection result of the detecting circuit.

18. The device according to claim 17, wherein the transfer circuit includes a selecting circuit for receiving the internal signal and an output signal from the internal circuit, the transfer circuit configured to select one of the internal signal and the output signal based on the detection result.

* * * * *